United States Patent [19]
Stanton

[11] Patent Number: 5,140,200
[45] Date of Patent: Aug. 18, 1992

[54] PIN DIODE ATTENUATOR

[75] Inventor: Robert Stanton, Warminster, Pa.

[73] Assignee: General Instrument Corporation, Hatboro, Pa.

[21] Appl. No.: 554,278

[22] Filed: Jul. 17, 1990

[51] Int. Cl.$^5$ .......................... H03K 5/08; H01P 1/22
[52] U.S. Cl. ..................... 307/540; 307/264; 307/565; 333/81 R
[58] Field of Search ............... 307/540, 555, 561, 564, 307/565, 264, 317.1, 318; 333/81 R

[56] References Cited

U.S. PATENT DOCUMENTS

| | | | |
|---|---|---|---|
| 3,289,120 | 11/1966 | Anders et al. | 307/317.1 |
| 3,529,266 | 9/1970 | King | 307/565 |
| 3,663,900 | 5/1972 | Peterson | 307/317.1 |
| 4,220,874 | 9/1980 | Iwata et al. | 307/564 |
| 4,378,536 | 3/1983 | Schwarzmann | 333/81 R |
| 4,494,084 | 1/1985 | Hughes | 307/564 |
| 4,617,522 | 10/1986 | Tarbutton et al. | |
| 4,625,178 | 11/1986 | Mannerstrom | |
| 4,646,036 | 2/1987 | Brown | 333/81 R |
| 4,668,882 | 5/1987 | Matsuura | 307/540 |

FOREIGN PATENT DOCUMENTS 2135656 12/1972 France .

OTHER PUBLICATIONS

Japanese Patent Application Abstract, Pub. No. 61-00-5-613, Patent Abstracts of Japan, vol. 10, No. 145, Jan. 11, 1986.
Japanese Patent Application Abstract, Pub. No. 01-04-9-413, Patent Abstracts of Japan, vol. 13, No. 248, Feb. 23, 1989.

Primary Examiner—John Zazworsky
Attorney, Agent, or Firm—Barry R. Lipsitz

[57] ABSTRACT

A signal processing circuit is provided, such as a PIN diode attenuator for use in cable television signal distribution. The circuit includes a variable impedance device that is responsive to an input signal. The input signal is provided over a first range to vary the impedance in response to a control signal having an absolute value below a predetermined threshold. The input signal is provided over a second range in response to the control signal having an absolute value above the threshold. The first and second ranges are not contiguous. In a preferred embodiment, a zener diode is used to increase the drive current to a bridged-T PIN diode attenuator when the attenuator control signal reaches the zener breakdown voltage.

8 Claims, 3 Drawing Sheets

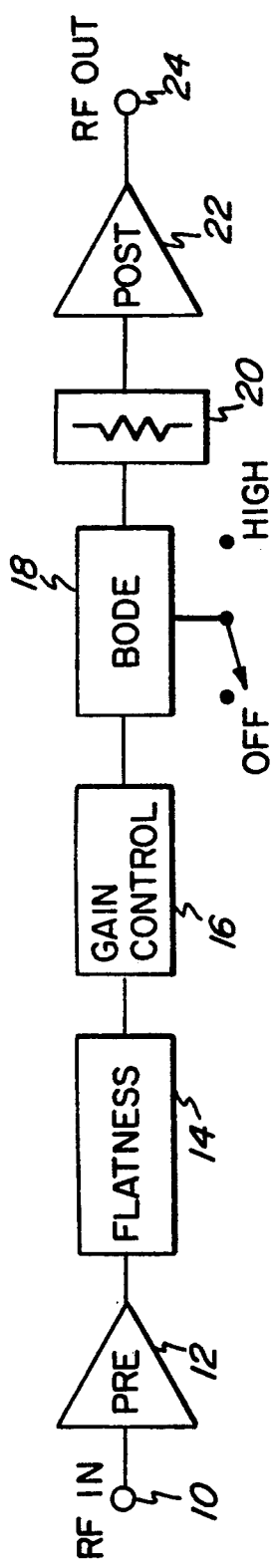
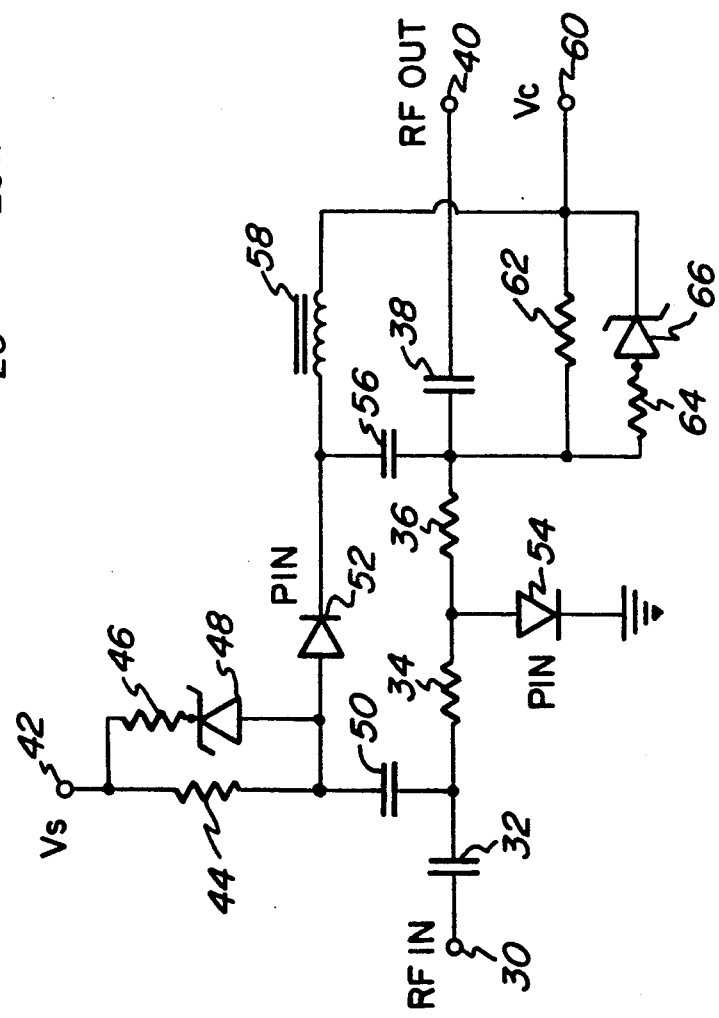

PIN DIODE ATTENUATOR

BACKGROUND OF THE INVENTION

The present invention relates to radio frequency ("RF") attenuator circuits and more particularly to a PIN diode attenuator having improved linearity and return loss.

In various RF communication applications, such as cable television networks, amplifiers are used along a signal path to maintain signal strength. Various amplifiers are known, particularly for cable television ("CATV") applications, that sense ambient temperature and change the gain and slope of the amplifier to compensate for cable losses. Such amplifiers typically comprise bridged-T RF PIN diode attenuators and cable equalizers.

Various ways are known for providing the drive currents necessary to operate PIN diode attenuators and cable equalizers. For example, the PIN diodes can be driven by pairs of transistors, pairs of operational amplifiers ("op-amps"), or fixed resistors. Such known methods of driving PIN diodes suffer several disadvantages. One disadvantage is that they do not provide a linear change of attenuation with control voltage. Thus, the attenuation of the PIN diode network does not vary linearly with drive current, so that the resultant attenuation and/or equalization is nonlinear with respect to changes in the control voltage. As a result, attenuation and equalization is typically very sensitive at the ends of the control voltage range and relatively insensitive at the center of the range. This nonlinearity makes it difficult to design accurate thermally controlled attenuators and other PIN diode signal processing circuits. Prior attempts to deal with the nonlinearity has made the resulting circuits quite complex.

Another disadvantage of PIN diode attenuators is that they do not exhibit good return loss at all settings of attenuation. It is desirable to hold RF circuits at a constant impedance. In cable television applications, for example, a 75 ohm impedance throughout the signal distribution path is optimal. Variations from the optimal line impedance cause the RF signals to be reflected off of the receiving device. With lower return loss, greater reflection will occur, creating ghosts in a received television video signal. It is desirable to hold the return loss in a cable television system to about 18 dB (or greater) across the whole band.

The curve of theoretically correct resistance, for the PIN diode, in a bridged-T RF attenuator is nonlinear. The nonlinearity required of the attenuator element does not match the nonlinearity of a PIN diode RF resistance. As a result, prior art bridge-T RF PIN diode attenuators do not exhibit good return loss at all settings of attenuation.

It would be advantageous to provide an improved signal processing circuit, such as a PIN diode RF attenuator, slope control circuit, or equalizer, that exhibits improved linearity. It would be further advantageous to provide such a signal processing circuit that exhibits good return loss over the operating range of the device. The present invention provides an improved circuit with the aforementioned advantages.

SUMMARY OF THE INVENTION

In accordance with the present invention, an improved signal processing circuit provides a variable impedance in response to an input signal. First means provide the input signal over a first range to vary the impedance in response to a control signal having an absolute value below a predetermined threshold. Second means responsive to the control signal provide the input signal over a second range when the absolute value of the control signal is above the threshold. The first and second ranges are not contiguous. In this manner, nonlinearities in the variable impedance device are compensated.

In a preferred embodiment, the variable impedance comprises a PIN diode. The input signal is a current passed through the PIN diode. The first means comprises a first resistor for supplying the input signal current. The second means comprises a second resistor for supplying the input signal current and a zener diode coupled to the second resistor for establishing the threshold. The second resistor and zener diode may be coupled in series, with the series combination connected in parallel with the first resistor.

In a more specific embodiment, an improved PIN diode attenuator circuit comprises first and second PIN diodes coupled in a bridged-T arrangement. First means supply current to the PIN diodes within a first range in response to an attenuation control signal below a threshold value. Second means responsive to an attenuation control signal above the threshold value supply current to the PIN diodes within a second range that is not contiguous with the first range. Each PIN diode in the bridged-T arrangement can be supplied by a separate control voltage circuit. Each of the control voltage circuits may comprise a zener diode and resistor in series, with the series combination connected in parallel with another resistor. When the threshold value is reached, the zener diode turns on placing the first resistor in parallel with the second resistor, effectively reducing the overall resistance of the pair. As a result, the current supplied to the corresponding PIN diode is substantially increased.

The circuit of the present invention may be used in various components of a CATV trunk amplifier, including the gain control section for attenuation and slope control, and the BODE equalizer stage for providing temperature compensation.

BRIEF DESCRIPTION OF THE DRAWINGS

FIG. 1 is a block diagram of a CATV trunk amplifier of the type in which the circuit of the present invention can be used;

FIG. 2 is a schematic diagram of a bridged-T RF PIN diode attenuator in accordance with the present invention;

DETAILED DESCRIPTION OF THE INVENTION

Figure 3:
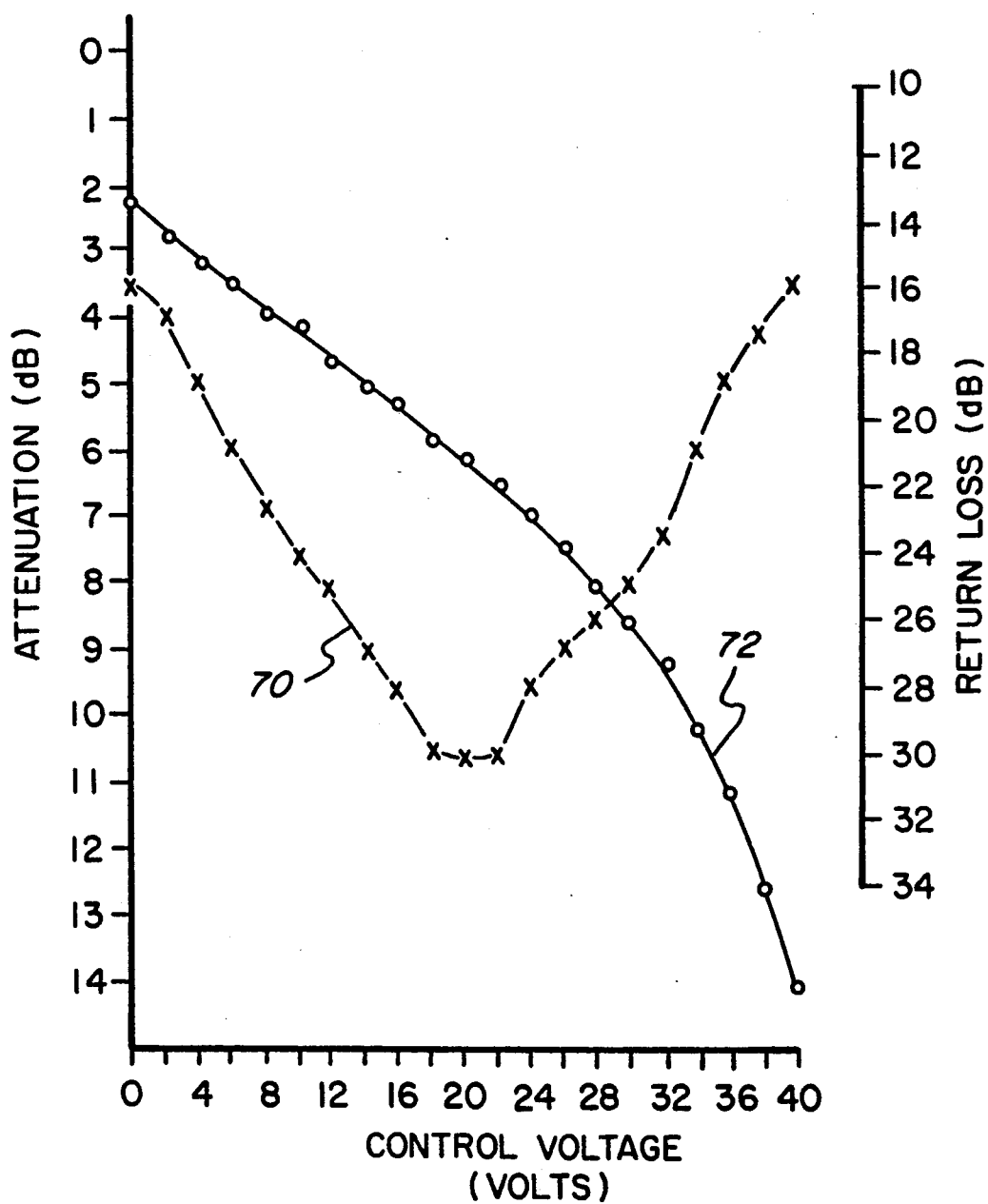
FIG. 3 is a graph illustrating the attenuation and return loss response of a prior art PIN diode bridged-T attenuator.

As shown in FIG. 1, a CATV trunk amplifier includes an RF input terminal 10 that is coupled to receive the cable signal for processing. The signal is passed through a preamplifier 12 to a flatness circuit 14 that provides an acceptable level of flatness in the frequency response of the amplifier so that different trunk amplifiers within a cable system will be generally uniform. The signal is then passed to gain control 16 that varies the gain of the trunk amplifier to provide the necessary amplification. A BODE equalizer 18 compensates for slope and level changes within the cable itself in response to temperature variations. Switch 26 coupled to BODE equalizer 18 provides a selection of cable length compensations. In the off position thermal guidance of the BODE equalizer is disabled, preventing the amplifier from overcompensating. The low position provides thermal guidance to the BODE equalizer equivalent to slope changes that would be seen over a specified length of cable. The high position provides thermal guidance to the BODE equalizer equivalent to the slope changes that would be seen over a longer specified length of cable. A fixed attenuator 20 is used to compensate for nonuniform trunk amplifier spacing along the transmission path. Post amplifier 22 provides further amplification to the signal before it is output at RF output terminal 24.

Variable impedance devices, such as PIN diodes, are typically utilized in the gain control and BODE equalizer portions of CATV trunk amplifiers. A circuit schematic for a bridged-T RF PIN diode attenuator in accordance with the present invention is shown in FIG. 2. This circuit may be advantageously used in the gain control section of a CATV trunk amplifier. A terminal 30 is provided to receive the RF signal, which is passed through a capacitor 32 to a bridged-T attenuator including PIN diodes 52, 54. Capacitors 50, 56 are provided for DC isolation, and resistors 34, 36 provide a proper impedance (e.g., 75 $\Omega$) for the circuit. A signal attenuated by the bridged-T attenuator is passed via capacitor 38 to RF output terminal 40.

In accordance with the present invention, control current is provided to PIN diode 52 via a novel arrangement of resistor 44 and series resistor 46/zener diode 48. Similarly, control current for PIN diode 54 is provided by the arrangement of resistor 62 and series resistor 64/zener diode 66. A supply voltage $V_s$ (e.g., 19 volts) is provided at terminal 42. A variable control voltage $V_c$ (e.g., 0–1..9 volts) is provided at terminal 60 for controlling the attenuation of the circuit.

In operation, current to PIN diode 52 will flow only through resistor 44 until such time as the voltage across zener diode 48 ($V_s - V_c$) exceeds the zener diode threshold voltage (e.g., 12 volts). At this point, zener diode 48 ("switch means") will conduct and place resistor 46 in parallel with resistor 44. This lowers the overall resistance in series with PIN diode 52, providing a greater input current to linearize the response of the PIN diode.

Similarly, current will be supplied to PIN diode 54 through resistor 62 until the voltage across the zener diode 66 ("switch means") exceeds its threshold. When the zener threshold is exceeded, resistor 64 is placed in parallel with resistor 62 to provide a higher current to drive PIN diode 54. Resistors 44 and 62 thereby provide a drive signal over a first current range to the PIN diodes when the control signal $V_c$ has an absolute value below a predetermined threshold. The combination of resistors 44, 46 and 62, 64 provide the PIN diode drive signal current over a second range when the absolute value of the control voltage $V_c$ is above the predetermined threshold. By virtue of the resistor values, the first and second ranges are not contiguous, but are designed to operate the circuit at desired points in the attenuator response curves. A choke 58 is provided to block undesirable AC signal components.

Figure 4:
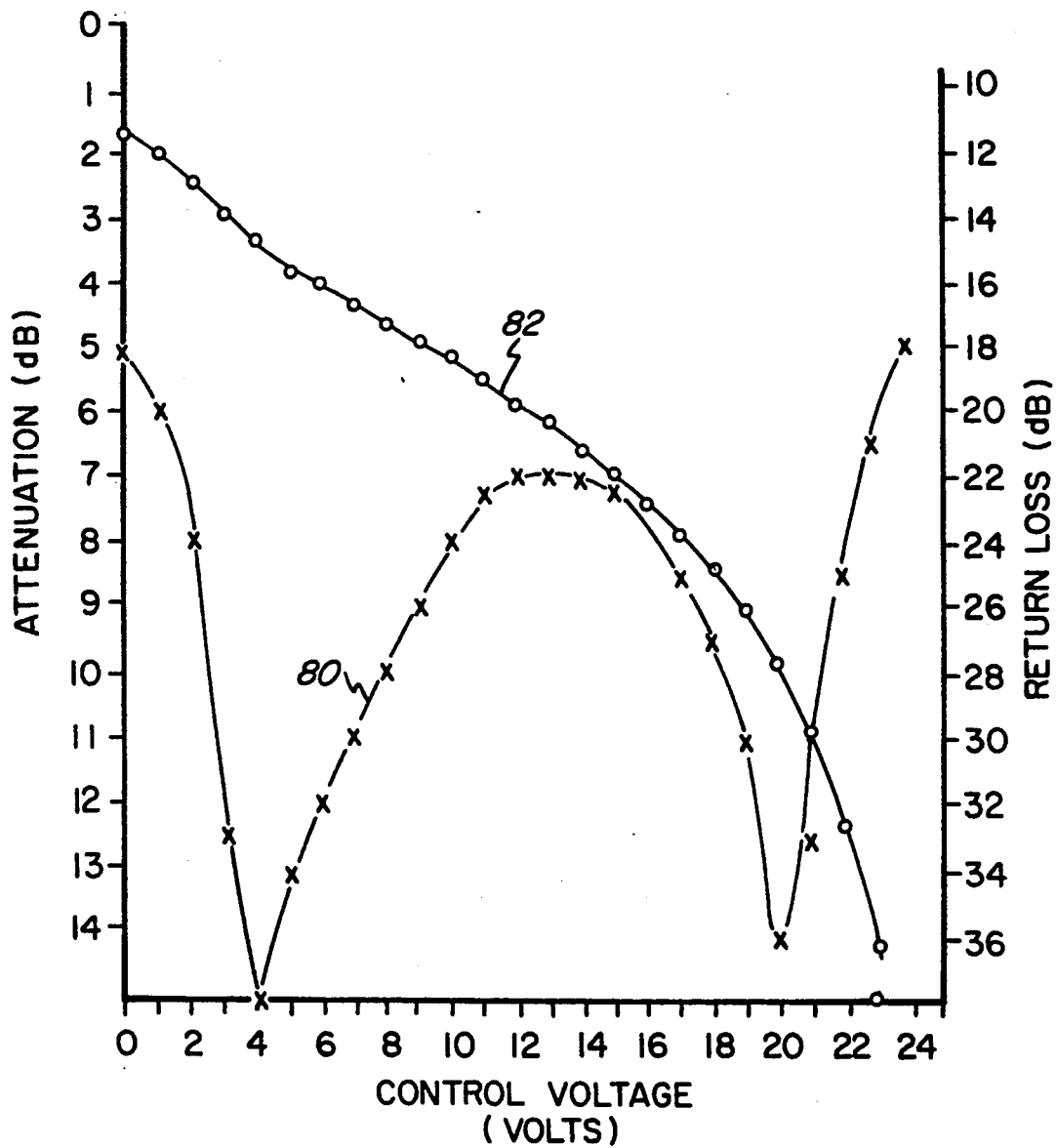
FIG. 4 is a graph illustrating the improved attenuation and return loss response provided by a PIN diode bridged-T attenuator in accordance with the present invention.

The graphs of FIGS. 3 and 4 illustrate the improvement in attenuation and return loss response provided by the circuit of the present invention. As shown in FIG. 3, prior art bridged-T RF attenuators provide a nonlinear return loss response 70 that is acceptable only over a small range of control voltage. As shown in the example illustrated, a return loss of better than 18 dB (curve 70) is only provided over an attenuation range of about 3–12 dB (curve 72).

In the circuit of the present invention, as illustrated in the graph of FIG. 4, a return loss of better than 18 dB (curve 80) is provided all the way from about 1.7 dB to 14 dB of attenuation (curve 82). In addition, the minimum attenuation obtainable in the prior art circuit as evidenced by curve 72 was approximately 2.3 dB. In the circuit of the present invention, attenuation curve 82 indicates a minimum attenuation of about 1.7 dB for an otherwise comparable circuit.

As can be seen by comparing FIGS. 3 and 4, the return loss curve 80 of a circuit in accordance with the present invention provides two nulls of good return loss instead of the single null exhibited in prior art circuits as shown by curve 70. This results in a substantially improved return loss across the range of attenuation. Further, the circuit of the present invention provides improved linearity in the attenuation as the control voltage is increased.

It will now be appreciated that the present invention provides an improved signal processing circuit, in which the response of a variable impedance such as a PIN diode is linearized. In RF communication applications, such as a cable television system, improved return loss is also achieved. Although the invention has been described in connection with a PIN diode RF attenuator, the novel use of a zener diode network to provide alternate control current ranges is also applicable to variable impedance circuits used for other purposes, such as slope control and equalization. Those skilled in the art will appreciate that numerous other adaptations and modifications may be made without departing from the spirit and scope of the invention as set forth in the following claims.

What is claimed is:

1. A PIN diode attenuator circuit providing improved return loss performance comprising:
   first and second PIN diodes coupled in a bridged-T arrangement; and
   means coupled to said PIN diodes and responsive to an attenuation control signal for limiting current to said PIN diodes using a first impedance when said attenuation control signal is below a threshold value and
   for limiting current to said PIN diodes using a second impedance that is not contiguous with said first impedance when said attenuation control signal is above said threshold value.

2. A PIN diode attenuator circuit providing improved return loss performance comprising:
   first and second PIN diodes coupled in a bridged-T arrangement;
   a first circuit path responsive to an attenuation control signal for supplying a first drive current to said first PIN diode when said attenuation control signal is below a threshold value
   and for supplying a second drive current to said first PIN diode when said attenuation control signal is above said threshold value, wherein said first and second drive currents are not contiguous with one another; and a second circuit path for supplying a third drive current to said second PIN diode when said attenuation control signal is below said threshold value and for supplying a fourth drive current to said second PIN diode when said attenuation control signal is above said threshold value, wherein said third and fourth drive currents are not contiguous with one another.

3. A circuit in accordance with claim 2 wherein:

said first circuit path comprises a first resistor coupled in parallel with a series connected second resistor and zener diode to supply said first PIN diode with a drive current; and said second circuit path comprises a third resistor coupled in parallel with a series connected fourth resistor and zener diode to supply said second PIN diode with a drive current.

4. A circuit in accordance with claim 3 wherein:

the parallel combination of said first circuit path is coupled between a supply voltage and said attenuation control signal; and the parallel combination of said second circuit path is coupled between said attenuation control signal and ground.

5. A circuit in accordance with claim 4 wherein:

said first and third drive currents are substantially identical; and said second and fourth drive currents are substantially identical.

6. A circuit in accordance with claim 3 wherein:

the parallel combination of said first circuit path is coupled in series with said first PIN diode; and the parallel combination of said second circuit path is coupled in series with said second PIN diode.

7. A circuit in accordance with claim 6 wherein:

said first and third drive currents are substantially identical; and said second and fourth drive currents are substantially identical.

8. A circuit in accordance with claim 2 wherein:

said first and third drive currents are substantially identical; and said second and fourth drive currents are substantially identical.

* * * * *